United States Patent
Ha et al.

(10) Patent No.: US 7,498,667 B2
(45) Date of Patent: Mar. 3, 2009

(54) STACKED INTEGRATED CIRCUIT PACKAGE-IN-PACKAGE SYSTEM

(75) Inventors: Jong-Woo Ha, Seoul (KR); Gwang Kim, Kyoungki-do (KR); JuHyun Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 260 days.

(21) Appl. No.: 11/379,106

(22) Filed: Apr. 18, 2006

(65) Prior Publication Data

US 2007/0241453 A1    Oct. 18, 2007

(51) Int. Cl.
*H01L 23/02* (2006.01)
*H01L 23/48* (2006.01)

(52) U.S. Cl. .................. 257/686; 257/787; 257/723; 257/E23.178; 257/784

(58) Field of Classification Search .................. 257/686, 257/723, 787, E23.178, 784
See application file for complete search history.

(56) References Cited

U.S. PATENT DOCUMENTS

| | | | |
|---|---|---|---|
| 5,373,189 A | * | 12/1994 | Massit et al. ................. 257/686 |
| 6,239,496 B1 | * | 5/2001 | Asada ......................... 257/777 |
| 6,414,381 B1 | * | 7/2002 | Takeda ........................ 257/676 |
| 6,605,875 B2 | | 8/2003 | Eskildsen |
| 6,900,528 B2 | | 5/2005 | Mess et al. |
| 6,946,323 B1 | | 9/2005 | Heo |
| 6,972,481 B2 | | 12/2005 | Karnezos |
| 6,982,488 B2 | | 1/2006 | Shin et al. |
| 7,132,753 B1 | * | 11/2006 | St. Amand et al. ........... 257/777 |
| 7,282,793 B2 | * | 10/2007 | Akram ......................... 257/686 |
| 2005/0029645 A1 | * | 2/2005 | Mess et al. ................... 257/686 |
| 2006/0076690 A1 | * | 4/2006 | Khandros et al. ............ 257/777 |

* cited by examiner

*Primary Examiner*—Nitin Parekh
(74) *Attorney, Agent, or Firm*—Mikio Ishimaru

(57) ABSTRACT

A stacked integrated circuit package-in-package system is provided forming a first integrated circuit package having a first peripheral contact, forming a second integrated circuit package having a second peripheral contact, stacking the second integrated circuit package on the first integrated circuit package in a multidirectional offset stack configuration with the first peripheral contact exposed, the multidirectional offset stack configuration provides a second package overhang with the second integrated circuit package above the first integrated circuit package, electrically connecting the first peripheral contact and a package substrate contact along a package first edge, and electrically connecting the second peripheral contact and the package substrate contact along a package second edge.

20 Claims, 6 Drawing Sheets

STACKED INTEGRATED CIRCUIT PACKAGE-IN-PACKAGE SYSTEM

CROSS-REFERENCES TO RELATED APPLICATION(S)

The present application contains subject matter related to a co-pending U.S. Patent Application by Jong-Woo Ha, Gwang Kim, and JuHyun Park entitled "Stacked Integrated Circuit Package-in-Package System". The related application is assigned to STATS ChipPAC Ltd. and is identified by Ser. No. 11/379,097. The subject matter thereof in its entirety is hereby incorporated by reference thereto.

TECHNICAL FIELD

The present invention relates generally to integrated circuit packages and more particularly to stacked integrated circuit packages.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice or package in package (PIP) or a combination thereof. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction. Other approaches form stack configuration utilizing PIP without separate spacers. However, these approaches severely limit the input/output connectivity within and external to the PIP device constraining the usefulness of these structures.

Thus, a need still remains for a stacked integrated circuit package-in-package system providing low cost manufacturing, improved yields, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package-in-package system including forming a first integrated circuit package having a first peripheral contact, forming a second integrated circuit package having a second peripheral contact, stacking the second integrated circuit package on the first integrated circuit package in a multidirectional offset stack configuration with the first peripheral contact exposed, the multidirectional offset stack configuration provides a second package overhang with the second integrated circuit package above the first integrated circuit package, electrically connecting the first peripheral contact and a package substrate contact along a package first edge, and electrically connecting the second peripheral contact and the package substrate contact along a package second edge.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
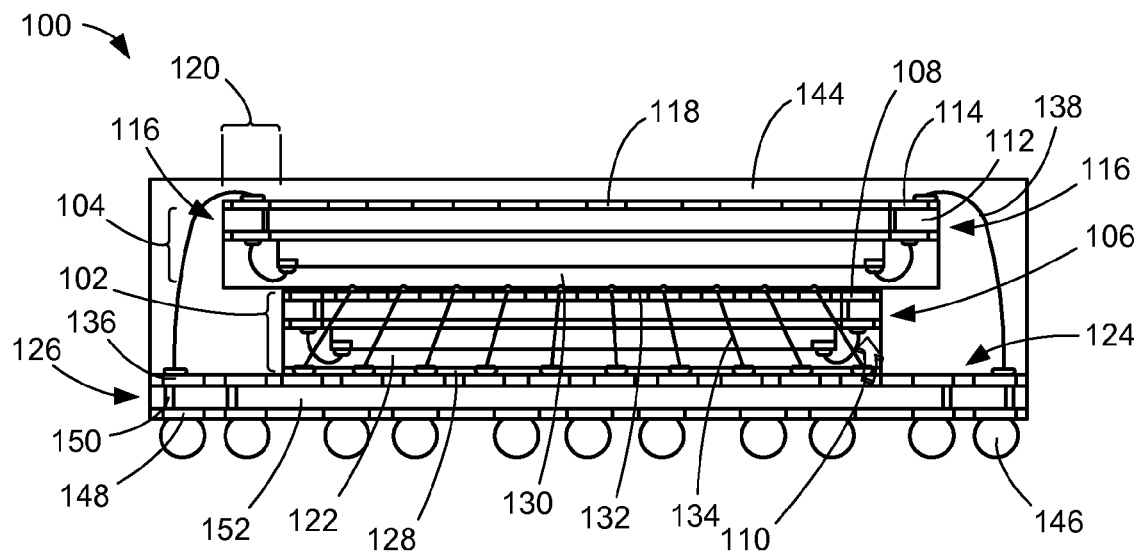
FIG. 1 is a cross-sectional view of a first stacked integrated circuit package-in-package system in an embodiment of the present invention.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a first stacked integrated circuit package-in-package system 100 in an embodiment of the present invention. The first stacked integrated circuit package-in-package system 100 packs more integrated circuits while decreasing overall package height, increasing bonding flexibility, simplifying manufacturing process, increasing yield, and reducing the overall cost through a multidirectional offset stack configuration.

The multidirectional offset stack configuration has a first integrated circuit package system 102 stacked below a second integrated circuit package system 104. The first integrated circuit package system 102 having a first package substrate 106 has first peripheral contacts 108, such as terminal pads, along first opposite edges 110 of the first package substrate 106. The second integrated circuit package system 104 having a second package substrate 112 has second peripheral contacts 114, such as terminal pads, along second opposite edges 116 of the second package substrate 112. The second integrated circuit package system 104 also includes inner contacts 118, such as terminal pads, in the interior of the second package substrate 112.

The second integrated circuit package system 104 is offset from the first integrated circuit package system 102 exposing the first peripheral contacts 108 along the first opposite edges 110. The second opposite edges 116 of the second integrated circuit package system 104 extends laterally beyond the first integrated circuit package system 102 forming second package overhangs 120.

Separate spacers, such as silicon spacers or interposer structures, are not used in this stacking configuration resulting in reduced manufacture steps, improved yield, reduced package height, and reduced cost. The first integrated circuit package system 102 and the second integrated circuit package system 104 may be tested before assembly in the first stacked integrated circuit package-in-package system 100 ensuring known good devices (KGD) and increasing yield.

A first encapsulation 122 of the first integrated circuit package system 102 attaches on a package substrate top surface 124 of a package substrate 126 with a first adhesive 128. The multidirectional offset stack configuration has a second encapsulation 130 of the second integrated circuit package system 104 attached on the first package substrate 106 of the first integrated circuit package system 102 with a second adhesive 132.

First interconnects 134, such as bond wires, connect the first peripheral contacts 108 of the first integrated circuit package system 102 and package substrate top contacts 136, such as bond fingers, at the package substrate top surface 124. Second interconnects 138, such as bond wires, connect the second peripheral contacts 114 and the package substrate top contacts 136.

This multidirectional offset connection structure allows the adhesives, such as the first adhesive 128 and the second adhesive 132 to be thinner reducing the height of the first stacked integrated circuit package-in-package system 100. The multidirectional offset connection structure also allows for larger loop heights of the interconnects, such as the first interconnects 134, and the second interconnects 138, while separating the electrical connections to different edges of the package substrate 126 mitigating wire crossings, increasing yield, and reducing cost.

A package encapsulation 144, such as an epoxy mold compound, covers the first integrated circuit package system 102, the second integrated circuit package system 104, the first interconnects 134, and the second interconnects 138. External interconnects 146, such as solder balls, also attach on package substrate bottom contacts 148 for further connections to a next system level (not shown), such as a printed circuit board or another integrated circuit package.

The package substrate bottom contacts 148 and the package substrate top contacts 136 may be part of conductive traces (not shown) in the package substrate 126. Electrical vias 150 connect the package substrate bottom contacts 148, the package substrate top contacts 136, and other conductive traces in a predetermined configuration. An insulation 152, such as a dielectric, isolates the conductive traces from each other and the electrical vias 150 from each other as well as provides structural support for the package substrate 126. For illustrative purpose, the package substrate 126 is shown as a two layer substrate, although it is understood that the number of layers may be different.

Figure 2:
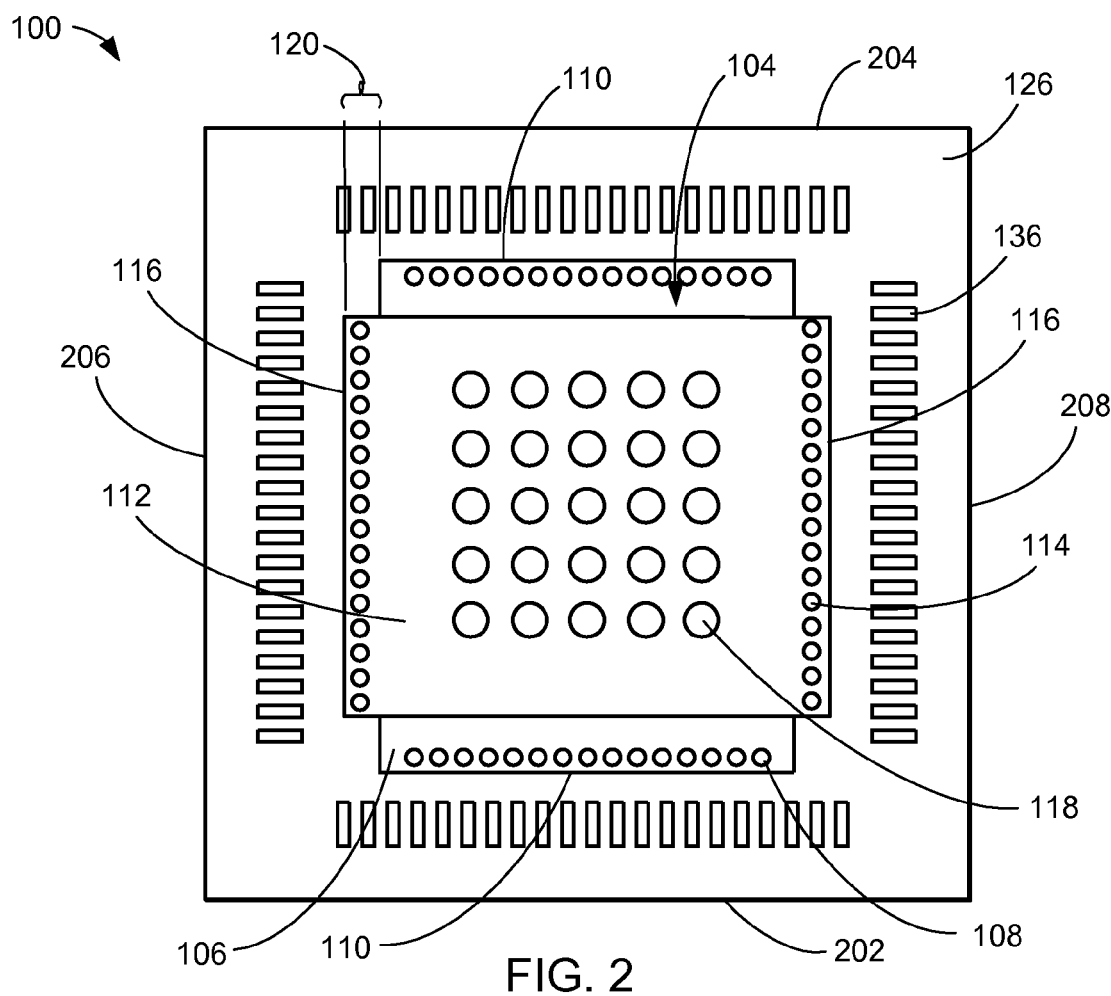
FIG. 2 is a plan view of the first stacked integrated circuit package-in-package system.

Referring now to FIG. 2, therein is shown a plan view of the first stacked integrated circuit package-in-package system 100. The multidirectional offset stack configuration has the first integrated circuit package system 102 above the package substrate 126 with a portion the package substrate top contacts 136 exposed beyond the first opposite edges 110 of the first package substrate 106. This portion of the package substrate top contacts 136 along a package first edge 202 and a package third edge 204, opposite to the package first edge 202, of the first stacked integrated circuit package-in-package system 100 are used for electrical connections to the first peripheral contacts 108.

The second integrated circuit package system 104 is above and offset from the first integrated circuit package system 102 exposing the first peripheral contacts 108 along the first opposite edges 110 and forming the second package overhangs 120 along the second opposite edges 116. The second integrated circuit package system 104 also exposes another portion the package substrate top contacts 136 beyond the second opposite edges 116. This portion of the package substrate top contacts 136 along a package second edge 206 and a package fourth edge 208, opposite to the package second edge 206, of the first stacked integrated circuit package-in-package system 100 are used for electrical connections to the second peripheral contacts 114. The inner contacts 118 are shown on the second package substrate 112.

For illustrative purpose, opposite edges the first integrated circuit package system 102 and the second integrated circuit package system 104 are exposed allowing further electrical connections, although it is understood that a different number of edges may be exposed. Also for illustrative purpose, the first integrated circuit package system 102 and the second integrated circuit package system 104 are stacked substantially symmetric to the other package, although it is understood that the packages in the multidirectional offset stack configuration may not be stacked symmetrically relative to one and another. Further for illustrative purpose, the multidirectional offset stack configuration is shown exposing the opposite sides of the first integrated circuit package system 102 and the second integrated circuit package system 104, although it is understood that different edges in the stack may be exposed in a different pattern.

Figure 3:
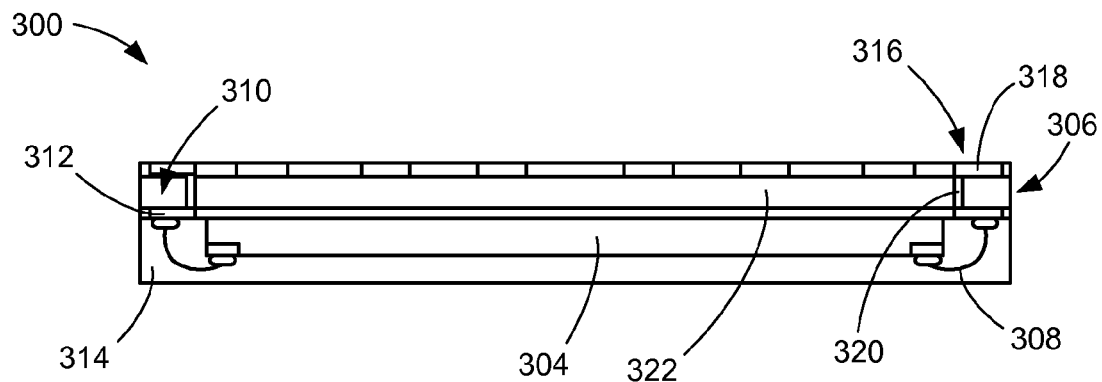
FIG. 3 is a cross-sectional view of an integrated circuit package system in an embodiment of the present invention.

Referring now to FIG. 3, therein is shown a cross-sectional view of an integrated circuit package system 300 in an embodiment of the present invention. The integrated circuit package system 300 may represent a structure for the first integrated circuit package system 102 of FIG. 1, the second integrated circuit package system 104 of FIG. 1, and other integrated circuit package system in other following embodiments. The integrated circuit package system 300 is the package inside the first stacked integrated circuit package-in-package system 100 of FIG. 1.

The integrated circuit package system 300 includes an integrated circuit die 304 attached on a substrate 306, such as an organic or inorganic carrier. Interconnects 308, such as bond wires, connect the integrated circuit die 304 to a first metal layer 310 of the substrate 306. The first metal layer 310 connects to first contacts 312, such as bond fingers.

An encapsulation 314 covers and protects the integrated circuit die 304 and the interconnects 308. The encapsulation 314 also protects the integrated circuit package system 300 withstanding the stacking process and the encapsulation process forming the first stacked integrated circuit package-in-package system 100 of FIG. 1.

The substrate 306 also includes a second metal layer 316 for connections of the integrated circuit package system 300 to a next system level, such as the package substrate 126 of FIG. 1, a printed circuit board (not shown), or another integrated circuit package (not shown). The second metal layer 316 connects to second contacts 318, such as terminal pads, peripheral contacts, or inner contacts, on a side opposite of the substrate 306 to the first contacts 312. Electrical vias 320 connect traces of the first metal layer 310 to the second metal layer 316 in a predetermined configuration. An insulation 322, such as a dielectric, isolates the traces of the first metal layer 310 from each other, the traces of the second metal layer 316 from each other, the electrical vias 320 from each other, and the first metal layer 310 with the second metal layer 316 as well as provides structural support for the substrate 306.

For illustrative purpose, the integrated circuit die 304 is shown as a bare die, although it is understood that the integrated circuit die 304 may not be bare. Also for illustrative purpose, the substrate 306 is shown as having two layers of metal, although it is understood that the number layers may differ. Further for illustrative purpose, the integrated circuit package system 300 is shown not having stacked integrated circuits, although it is understood that the integrated circuit package system 300 may also have stacked integrated circuits as well as may have package-in-package configuration.

Figure 4:
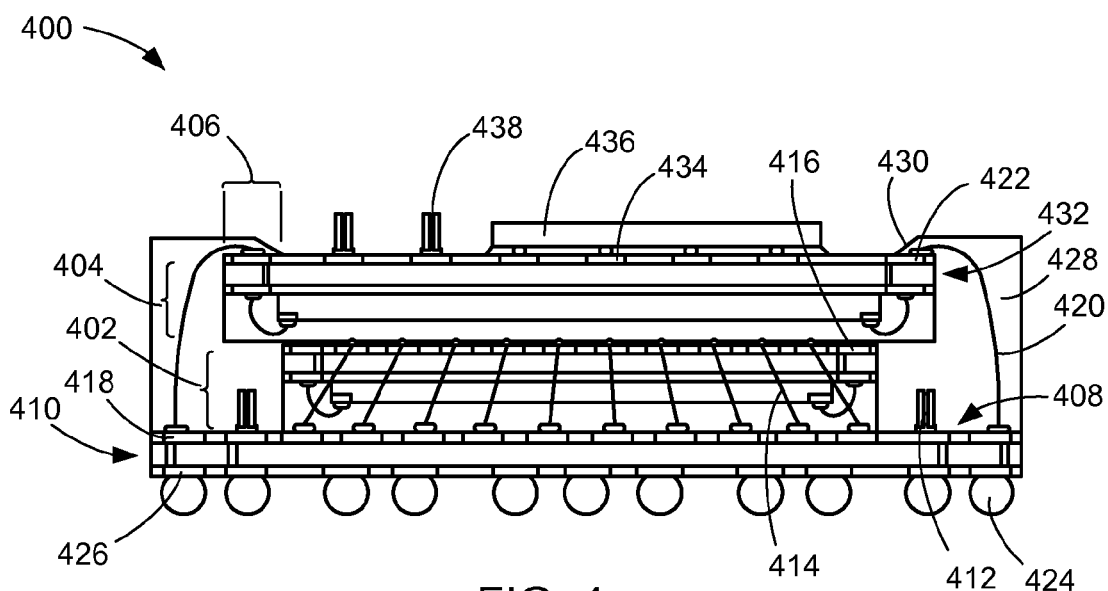
FIG. 4 is a cross-sectional view of a second stacked integrated circuit package-in-package system in an alternative embodiment of the present invention.

Referring now to FIG. 4, therein is shown a cross-sectional view of a second stacked integrated circuit package-in-package system 400 in an alternative embodiment of the present invention. The second stacked integrated circuit package-in-package system 400 is similar in structure to the first stacked integrated circuit package-in-package system 100 of FIG. 1.

The second stacked integrated circuit package-in-package system 400 includes the multidirectional offset stack configuration with a first integrated circuit package system 402 stacked below a second integrated circuit package system 404 forming second package overhangs 406. The first integrated circuit package system 402 is on a package substrate top surface 408 of a package substrate 410. First components 412, such as discrete passive devices, are also on the package substrate top surface 408 next to the first integrated circuit package system 402 and below the second package overhangs 406.

First interconnects 414 connect first peripheral contacts 416 of the first integrated circuit package system 402 and package substrate top contacts 418. Second interconnects 420 connect second peripheral contacts 422 of the second integrated circuit package system 404 and package substrate top contacts 418. External interconnects 424 also connect to package substrate bottom contacts 426.

A package encapsulation 428 has a recess 430 at a top of the package encapsulation 428 exposing a non-peripheral portion of a second package substrate 432 of the second integrated circuit package system 404, wherein the package encapsulation 428 covers the second interconnects 420 on the second package substrate 432. The package encapsulation 428 also covers the first integrated circuit package system 402, the first interconnects 414, and the first components 412 with the second integrated circuit package system 404 partially covered. The recess 430 exposes inner contacts 434 of the second package substrate 432 allowing other devices to mount onto the second stacked integrated circuit package-in-package system 400 forming a package-on-package configuration. A flip chip 436 and second components 438, such as discrete passive devices, mount on the second package substrate 432 in the recess 430.

Figure 5:
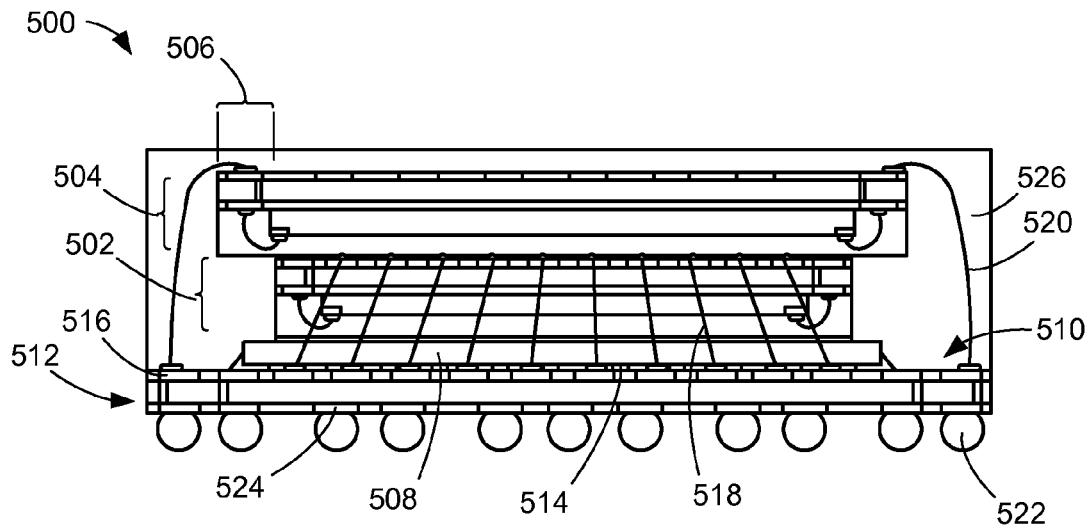
FIG. 5 is a cross-sectional view of a third stacked integrated circuit package-in-package system in another alternative embodiment of the present invention.

Referring now to FIG. 5, therein is shown a cross-sectional view of a third stacked integrated circuit package-in-package system 500 in another alternative embodiment of the present invention. The third stacked integrated circuit package-in-package system 500 has a similar multidirectional offset stack configuration to the second stacked integrated circuit package-in-package system 400 of FIG. 4 with a first integrated circuit package system 502 and a second integrated circuit package system 504.

The third stacked integrated circuit package-in-package system 500 includes the multidirectional offset stack configuration with the first integrated circuit package system 502 stacked below the second integrated circuit package system 504 forming second package overhangs 506. An integrated circuit die 508, such as a flip chip, stacks below the first integrated circuit package system 502. The integrated circuit die 508 is on a package substrate top surface 510 of a package substrate 512.

Die interconnects 514, such as solder bumps, connect the integrated circuit die 508 and package substrate top contacts 516. First interconnects 518 connect the first integrated circuit package system 502 and the package substrate top contacts 516. Second interconnects 520 connect the second integrated circuit package system 504 and the package substrate top contacts 516. External interconnects 522 connect to package substrate bottom contacts 524. A package encapsulation 526 covers the first integrated circuit package system 502, the second integrated circuit package system 504, the integrated circuit die 508, the first interconnects 518, and the second interconnects 520.

Figure 6:
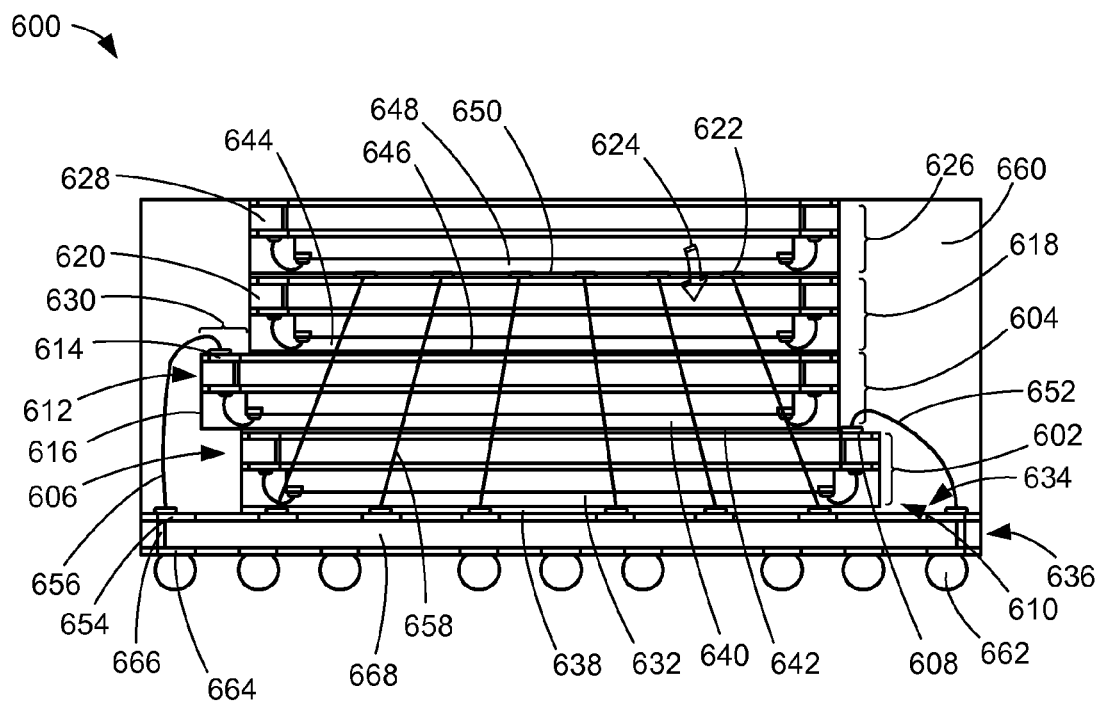
FIG. 6 is a cross-sectional view of a fourth stacked integrated circuit package-in-package system in yet another alternative embodiment of the present invention.

Referring now to FIG. 6, therein is shown a cross-sectional view of a fourth stacked integrated circuit package-in-package system 600 in yet another alternative embodiment of the present invention. The fourth stacked integrated circuit package-in-package system 600 packs more integrated circuits while decreasing overall package height, increasing bonding flexibility, simplifying manufacturing process, increasing yield, and reducing the overall cost through a multidirectional offset stack configuration.

The multidirectional offset stack configuration has the devices in the stack offset in different directions. A first integrated circuit package system 602 stacked below a second integrated circuit package system 604. The first integrated circuit package system 602 having a first package substrate 606 has first peripheral contacts 608, such as terminal pads, along a first edge 610 of the first package substrate 606. The second integrated circuit package system 604 having a second package substrate 612 has second peripheral contacts 614, such as terminal pads, along a second edge 616 of the second package substrate 612.

A third integrated circuit package system 618 stacks on the second integrated circuit package system 604. The third integrated circuit package system 618 having a third package substrate 620 has third peripheral contacts 622, such as terminal pads, along a third edge 624 of the third package substrate 620. A fourth integrated circuit package system 626 stacks on the third integrated circuit package system 618. The fourth integrated circuit package system 626 having a fourth package substrate 628 has fourth peripheral contacts 716 shown in FIG. 7, such as terminal pads, along a fourth edge 712 shown in FIG. 7 of the fourth package substrate 628.

The second integrated circuit package system 604 is offset from the first integrated circuit package system 602 exposing the first peripheral contacts 608. The second edge 616 of the second integrated circuit package system 604 extends beyond the first integrated circuit package system 602 forming a second package overhang 630.

The third integrated circuit package system 618 is offset from the second integrated circuit package system 604 exposing the second peripheral contacts 614. The third edge 624 of the third integrated circuit package system 618 extends beyond the second integrated circuit package system 604 forming a third package overhang 706 shown in FIG. 7.

The fourth integrated circuit package system 626 is offset from the third integrated circuit package system 618 exposing the third peripheral contacts 622. The fourth edge 712 shown in FIG. 7 of the fourth integrated circuit package system 626 extends beyond the third integrated circuit package system 618 forming a fourth package overhang 710 shown in FIG. 7.

Separate spacers, such as silicon spacers or interposer structures, are not used in this stacking configuration resulting in reduced manufacture steps, improved yield, reduced package height, and reduced cost. The first integrated circuit package system 602, the second integrated circuit package system 604, the third integrated circuit package system 618, and the fourth integrated circuit package system 626 may be tested before assembly in the fourth stacked integrated circuit package-in-package system 600 ensuring known good devices (KGD) and increasing yield.

The multidirectional offset stack configuration has a first encapsulation 632 of the first integrated circuit package system 602 attached on a package substrate top surface 634 of a package substrate 636 with a first adhesive 638. A second encapsulation 640 of the second integrated circuit package system 604 attaches on the first package substrate 606 of the first integrated circuit package system 602 with a second adhesive 642. A third encapsulation 644 of the third integrated circuit package system 618 attaches on the second package substrate 612 of the second integrated circuit package system 604 with a third adhesive 646. A fourth encapsulation 648 of the fourth integrated circuit package system 626 attaches on the third package substrate 620 of the third integrated circuit package system 618 with a fourth adhesive 650.

First interconnects 652, such as bond wires, connect the first peripheral contacts 608 of the first integrated circuit package system 602 and package substrate top contacts 654, such as bond fingers, at the package substrate top surface 634. Second interconnects 656, such as bond wires, connect the second peripheral contacts 614 and the package substrate top contacts 654. Third interconnects 658, such as bond wires, connect the third peripheral contacts 622 and the package substrate top contacts 654. Fourth interconnects (not shown), such as bond wires, connect the fourth peripheral contacts 716 shown in FIG. 7 and the package substrate top contacts 654.

This multidirectional offset connection structure allows the adhesives, such as the first adhesive 638, the second adhesive 642, the third adhesive 646, and the fourth adhesive 650 to be thinner reducing the height of the first stacked integrated circuit package-in-package system 100. The multidirectional offset connection structure also allows for larger loop heights of the interconnects, such as the first interconnects 652, the second interconnects 656, the third interconnects 658, and the fourth interconnects while separating the electrical connections to different edges of the package substrate 636 mitigating wire crossings, increasing yield, and reducing cost.

A package encapsulation 660, such as an epoxy mold compound, covers the first integrated circuit package system 602, the second integrated circuit package system 604, the third integrated circuit package system 618, and the fourth integrated circuit package system 626, the first interconnects 652, the second interconnects 656, the third interconnects 658, and the fourth interconnects. External interconnects 662 attach on package substrate bottom contacts 664 for further connections to a next system level (not shown), such as a printed circuit board or another integrated circuit package.

The package substrate bottom contacts 664 and the package substrate top contacts 654 may be part of conductive traces (not shown) in the package substrate 636. Electrical vias 666 connect the package substrate bottom contacts 664, the package substrate top contacts 654, and other conductive traces in a predetermined configuration. An insulation 668, such as a dielectric, isolates the conductive traces from each other and the electrical vias 666 from each other as well as provides structural support for the package substrate 636. For illustrative purpose, the package substrate 636 is shown as a two layer substrate, although it is understood that the number of layers may be different.

Figure 7:
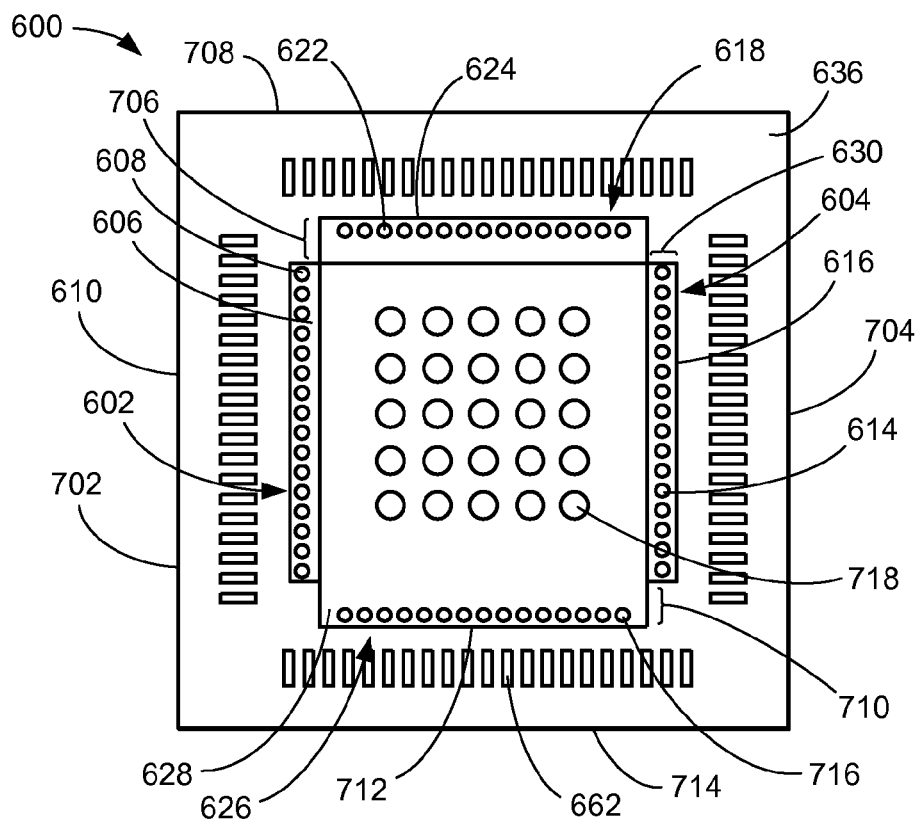
FIG. 7 is a plan view of the fourth stacked integrated circuit package-in-package system.

Referring now to FIG. 7, therein is shown a plan view of the fourth stacked integrated circuit package-in-package system 600. The multidirectional offset stack configuration has the first integrated circuit package system 602 above the package substrate 636 with the package substrate top contacts 662 exposed along a package first edge 702 beyond the first edge 610 of the first package substrate 606. The package substrate top contacts 662 along the package first edge 702 are used for electrical connections to the first peripheral contacts 608.

The second integrated circuit package system 604 is above and offset from the first integrated circuit package system 602 exposing the first peripheral contacts 608 along the first edge 610 and forming the second package overhang 630 along the second edge 616. The second integrated circuit package system 604 also exposes the package substrate top contacts 662 along a package second edge 704 beyond the second edge 616. The package substrate top contacts 662 along the package second edge 704 are used for electrical connections to the second peripheral contacts 614.

The third integrated circuit package system 618 is above and offset from the second integrated circuit package system 604 exposing the second peripheral contacts 614 along the second edge 616 and forming the third package overhang 706 along the third edge 624. The third integrated circuit package system 618 also exposes the package substrate top contacts 662 along a package third edge 708 beyond the third edge 624. The package substrate top contacts 662 along the package third edge 708 are used for electrical connections to the third peripheral contacts 622.

The fourth integrated circuit package system 626 is above and offset from the third integrated circuit package system 618 exposing the third peripheral contacts 622 along the third edge 624 and forming the fourth package overhang 710 along the fourth edge 712. The fourth integrated circuit package system 626 also exposes the package substrate top contacts 662 along a package fourth edge 714 beyond the fourth edge 712. The package substrate top contacts 662 along the package fourth edge 714 are used for electrical connections to the fourth peripheral contacts 716. The fourth integrated circuit package system 626 may optionally include inner contacts 718, such as terminal pads, in the interior region of the fourth package substrate 628.

For illustrative purpose, the first edge 610, the second edge 616, the third edge 624, and the fourth edge 712 are next to the package first edge 702, the package second edge 704, the package third edge 708, and the package fourth edge 714, respectively, although it is understood that the first edge 610, the second edge 616, the third edge 624, and the fourth edge 712 may be next to different edges of the package substrate 644. Also for illustrative purpose, the first integrated circuit package system 602, the second integrated circuit package system 604, the third integrated circuit package system 618, and the fourth integrated circuit package system 626 provide overhangs with the same dimensions, although it is understood that the multidirectional offset stack configuration may have overhangs that are different.

Figure 8:
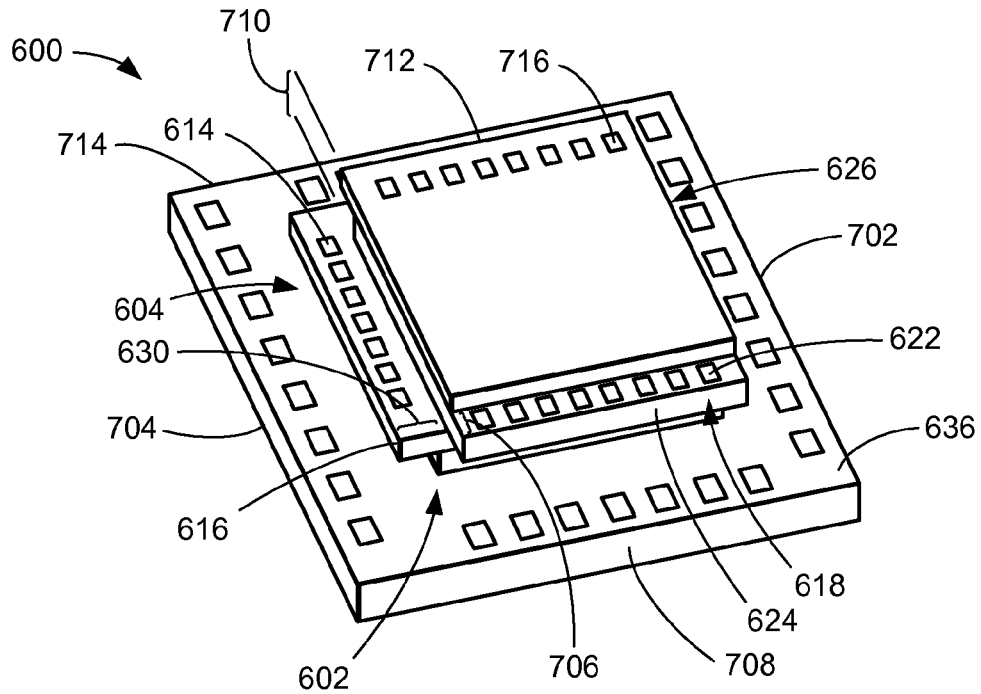
FIG. 8 is a perspective view of the fourth stacked integrated circuit package-in-package system.

Referring now to FIG. 8, therein is shown a perspective view of the fourth stacked integrated circuit package-in-package system 600. The multidirectional offset stack configuration has the devices in the stack offset in different directions. The first integrated circuit package system 602 is on the package substrate 636 with the first peripheral contacts 608 shown in FIG. 7 exposed along the package first edge 702.

The second integrated circuit package system 604 is on and offset from the first integrated circuit package system 602 forming the second package overhang 630 along the package second edge 704. The second peripheral contacts 614 are along the second edge 616.

The third integrated circuit package system 618 is on and offset from the second integrated circuit package system 604 forming the third package overhang 706 along the package third edge 708. The third peripheral contacts 622 are along the third edge 624.

The fourth integrated circuit package system 626 is on and offset from the third integrated circuit package system 618 forming the fourth package overhang 710 along the package fourth edge 714. The fourth peripheral contacts 716 are along the fourth edge 712.

Figure 9:
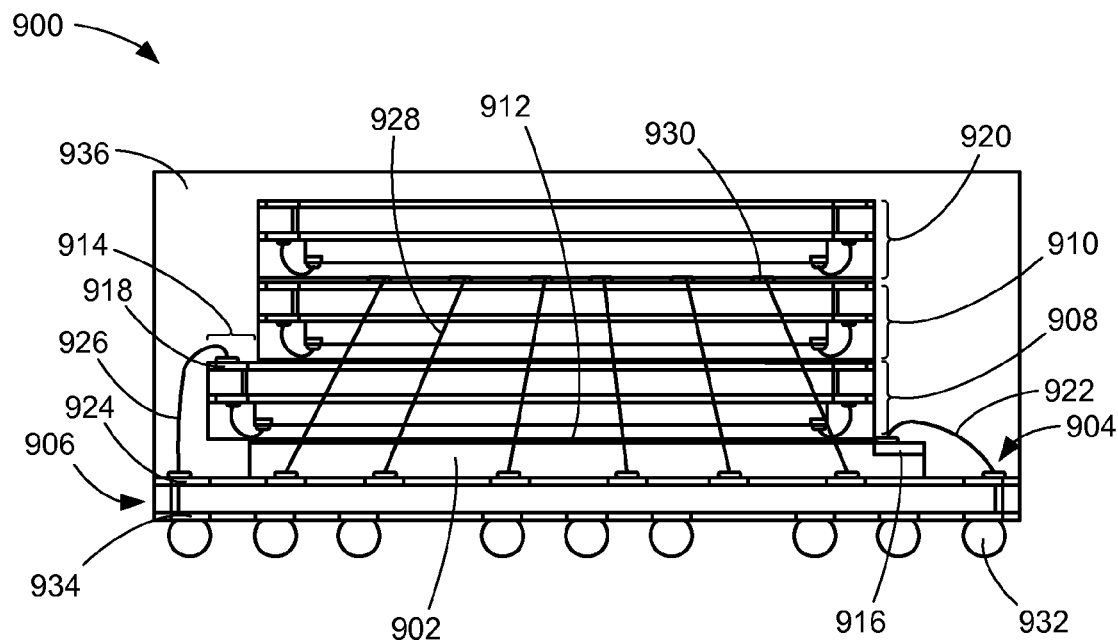
FIG. 9 is a cross-sectional view of a fifth stacked integrated circuit package-in-package system in yet another alternative embodiment of the present invention.

Referring now to FIG. 9, therein is shown a cross-sectional view of a fifth stacked integrated circuit package-in-package system 900 in yet another alternative embodiment of the present invention. The fifth stacked integrated circuit package-in-package system 900 includes the multidirectional offset stack configuration with an integrated circuit die 902 on a package substrate top surface 904 of a package substrate 906 and a first integrated circuit package system 908 stacked on the integrated circuit die 902. A second integrated circuit package system 910 stacks on the first integrated circuit package system 908.

The first integrated circuit package system 908 on an active side 912 of the integrated circuit die 902 forms a first package overhang 914 exposing bond pads 916 of the integrated circuit die 902. The second integrated circuit package system 910 on the first integrated circuit package system 908 forms a second package overhang (not shown) exposing first peripheral contacts 918 of the first integrated circuit package system 908. A third integrated circuit package system 920 on the second integrated circuit package system 910 forms a third package overhang (not shown) exposing second peripheral contacts # of the second integrated circuit package system 910.

Die interconnects 922, such as bond wires, connect the bond pads 916 of the integrated circuit die 902 and package substrate top contacts 924, such as bond fingers, at the package substrate top surface 904. First interconnects 926 connect the first peripheral contacts 918 of the first integrated circuit package system 908 and the package substrate top contacts 924. Second interconnects 928 connect second peripheral contacts 930 of the second integrated circuit package system 910 and the package substrate top contacts 924. Third interconnects (not shown) connect third peripheral contacts (not shown) of the third integrated circuit package system 920. External interconnects 932 connect to package substrate bottom contacts 934.

A package encapsulation 936 covers the integrated circuit die 902, the first integrated circuit package system 908, the second integrated circuit package system 910, and the third integrated circuit package system 920. The package encapsulation 936 also covers the die interconnects 922, the first interconnects 926, the second interconnects 928, and the third interconnects.

Figure 10:
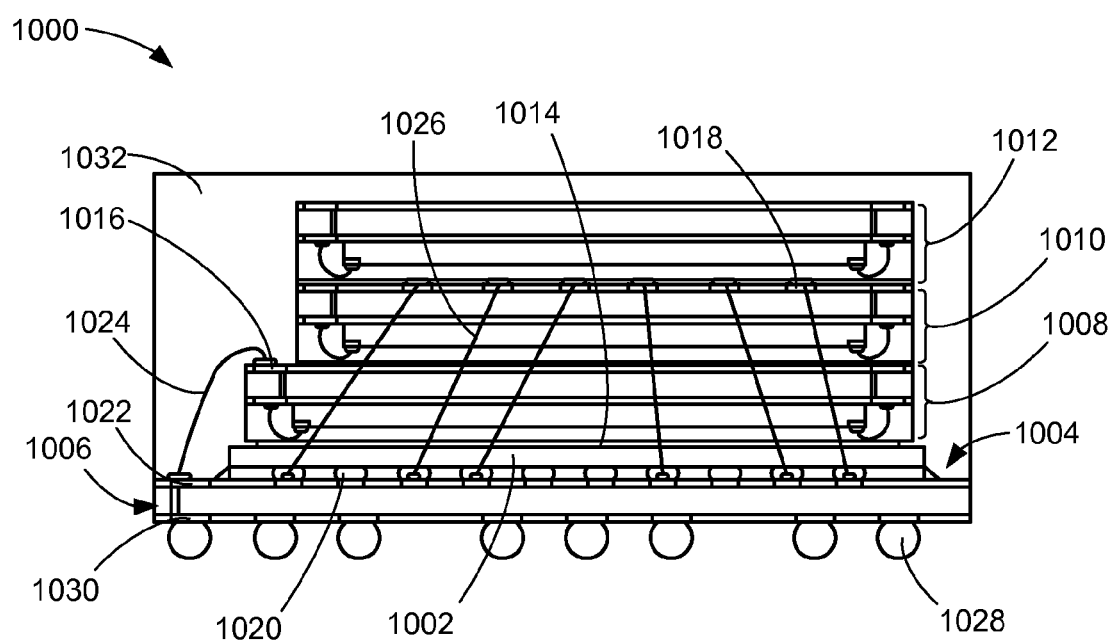
FIG. 10 is a cross-sectional view of a sixth stacked integrated circuit package-in-package system in yet another alternative embodiment of the present invention.

Referring now to FIG. 10, therein is shown a cross-sectional view of a sixth stacked integrated circuit package-in-package system 1000 in yet another alternative embodiment of the present invention. The sixth stacked integrated circuit package-in-package system 1000 includes the multidirectional offset stack configuration with an integrated circuit die 1002 on a package substrate top surface 1004 of a package substrate 1006 and a first integrated circuit package system 1008 stacked on the integrated circuit die 1002. A second integrated circuit package system 1010 stacks on the first integrated circuit package system 1008. A third integrated circuit package system 1012 stacks on the second integrated circuit package system 1010.

The first integrated circuit package system 1008 on a non-active side 1014 of the integrated circuit die 1002 may form a first package overhang (not shown). The second integrated circuit package system 1010 on the first integrated circuit package system 1008 forms a second package overhang (not shown) exposing first peripheral contacts 1016 of the first integrated circuit package system 1008. The third integrated circuit package system 1012 on the second integrated circuit package system 1010 forms a third package overhang (not shown) exposing second peripheral contacts 1018 of the second integrated circuit package system 1010.

Die interconnects 1020, such as solder bumps, connect the integrated circuit die 1002 and package substrate top contacts 1022 at the package substrate top surface 1004. First interconnects 1024 connect the first peripheral contacts 1016 of the first integrated circuit package system 1008 and the package substrate top contacts 1022. Second interconnects 1026 connect the second peripheral contacts 1018 of the second integrated circuit package system 1010 and the package substrate top contacts 1022. Third interconnects (not shown) connect third peripheral contacts (not shown) of the third integrated circuit package system 1012. External interconnects 1028 connect to package substrate bottom contacts 1030.

A package encapsulation 1032 covers the integrated circuit die 1002, the first integrated circuit package system 1008, the second integrated circuit package system 1010, and the third integrated circuit package system 1012. The package encapsulation 1032 also covers the die interconnects 1020, the first interconnects 1024, the second interconnects 1026, and the third interconnects.

Figure 11:
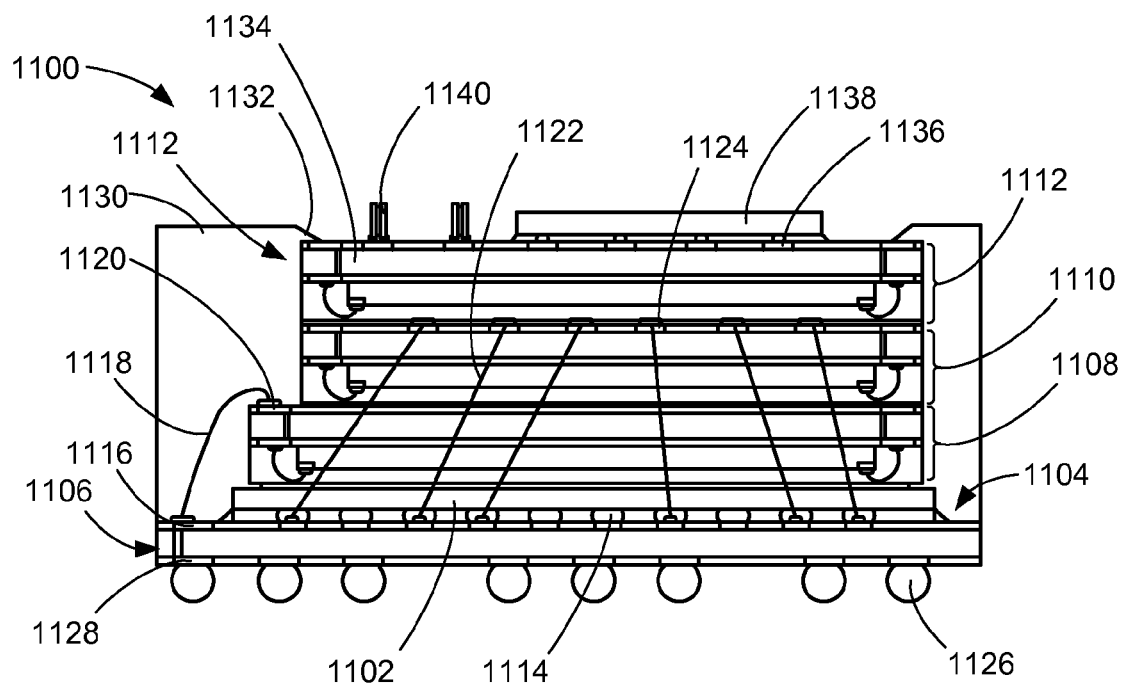
FIG. 11 is a cross-sectional view of a seventh stacked integrated circuit package-in-package system in yet another alternative embodiment of the present invention.

Referring now to FIG. 11, therein is shown a cross-sectional view of a seventh stacked integrated circuit package-in-package system 1100 in yet another alternative embodiment of the present invention. The seventh stacked integrated circuit package-in-package system 1100 is similar in structure to the sixth stacked integrated circuit package-in-package system 1000 of FIG. 10.

The seventh stacked integrated circuit package-in-package system 1100 includes the multidirectional offset stack configuration with an integrated circuit die 1102 on a package substrate top surface 1104 of a package substrate 1106 and a first integrated circuit package system 1108 stacked on the integrated circuit die 1102. A second integrated circuit package system 1110 stacks on the first integrated circuit package system 1108. A third integrated circuit package system 1112 stacks on the second integrated circuit package system 1110.

Die interconnects 1114, such as solder bumps, connect the integrated circuit die 1102 and package substrate top contacts 1116. First interconnects 1118 connect first peripheral contacts 1120 of the first integrated circuit package system 1108 and the package substrate top contacts 1116. Second interconnects 1122 connect second peripheral contacts 1124 of the second integrated circuit package system 1110 and the package substrate top contacts 1116. Third interconnects (not shown) connect third peripheral contacts (not shown) of the third integrated circuit package system 1112. External interconnects 1126 connect to package substrate bottom contacts 1128.

A package encapsulation 1130 has a recess 1132 at a top of the package encapsulation 1130 exposing a non-peripheral portion of a third package substrate 1134 of the second integrated circuit package system 1110. The package encapsulation 1130 also covers the first integrated circuit package system 1108, the die interconnects 1114, the first interconnects 1118, and the second interconnects 1122 with the second integrated circuit package system 1110 partially covered. The recess 1132 exposes inner contacts 1136 of the third package substrate 1134 allowing other devices to mount onto the seventh stacked integrated circuit package-in-package system 1100 forming a package-on-package configuration. A flip chip 1138 and components 1140, such as discrete passive devices, mount on the third package substrate 1134 in the recess 1132.

Figure 12:
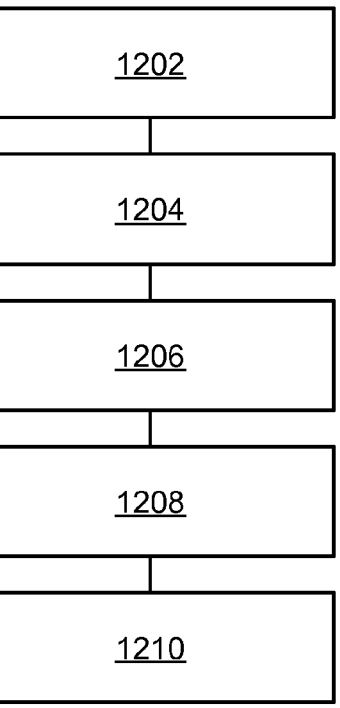
FIG. 12 is a flow chart of a stacked integrated circuit package-in-package system for manufacture of the stacked integrated circuit package-in-package system in an embodiment of the present invention.

Referring now to FIG. 12, therein is shown a flow chart of a stacked integrated circuit package-in-package system 1200 for manufacture of the stacked integrated circuit package-in-package system 100 in an embodiment of the present invention. The system 1200 includes forming a first integrated circuit package having a first peripheral contact in a block 1202; forming a second integrated circuit package having a second peripheral contact in a block 1204; stacking the second integrated circuit package on the first integrated circuit package in a multidirectional offset stack configuration with the first peripheral contact exposed, the multidirectional offset stack configuration provides a second package overhang with the second integrated circuit package above the first integrated circuit package in a block 1206; electrically connecting the first peripheral contact and a package substrate contact along a package first edge in a block 1208; and electrically connecting the second peripheral contact and the package substrate contact along a package second edge in a block 1210.

It has been discovered that the present invention thus has numerous aspects.

It has been discovered that the present invention provides packing more integrated circuits while decreasing overall package height, simplifying manufacturing process, increasing yield, and reducing the overall cost through a multidirectional offset stack configuration.

An aspect is that the present invention provides the multidirectional offset stack configuration of pre-packaged devices stacked in different directions providing a lower overall package height. Separate spacers are not required for the multidirectional offset stack configuration.

Another aspect of the present invention is that some or all the integrated circuit devices in the stack are offset such that one side or opposite sides of the integrated circuit devices are exposed for wire bonding. The bond wires are attached to the multidirectional offset stack configuration providing a stream line the manufacturing process.

Yet another aspect of the present invention is that the multidirectional offset stack configuration offers more flexibility for wire loop heights allowing thinner adhesive layers to be used in the stack. These features improves yield, lowers package height, and reduces overall manufacturing cost.

Yet another aspect of the present invention is that the multidirectional offset stack configuration allows integrated circuit devices to be stacked without substantially increasing the length and width of the overall package.

Thus, it has been discovered that the stacked integrated circuit package-in-package system method of the present invention furnishes important and heretofore unknown and unavailable solutions, capabilities, and functional aspects for improving thermal performance and reliability in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A stacked integrated circuit package-in-package system comprising:

forming a first integrated circuit package having a first peripheral contact;

forming a second integrated circuit package having a second peripheral contact;

stacking the second integrated circuit package on the first integrated circuit package in a multidirectional offset stack configuration with the first peripheral contact exposed, the multidirectional offset stack configuration provides a second package overhang with the second integrated circuit package above the first integrated circuit package;

electrically connecting the first peripheral contact and a package substrate contact along a package first edge; and electrically connecting the second peripheral contact and a package substrate contact along a package second edge.

2. The system as claimed in claim 1 further comprising:

electrically connecting the first peripheral contact and a package substrate contact along a package third edge opposite to the package first edge; and electrically connecting the second peripheral contact and the package substrate contact along a package fourth edge opposite to the package second edge.

3. The system as claimed in claim 1 further comprising:

forming the second integrated circuit package having a second package substrate, the second package substrate has an inner contact and the second peripheral contact;

forming an encapsulation having a recess to cover a portion of the second integrated circuit package, the recess exposes with the inner contact; and connecting a device on the inner contact in the recess.

4. The system as claimed in claim 1 further comprising:

stacking the first integrated circuit package on an integrated circuit die; and electrically connecting the integrated circuit die and the package substrate contact.

5. The system as claimed in claim 1 further comprising:

stacking a third integrated circuit package having a third peripheral contact on the second integrated circuit package to form a third package overhang along a package third edge;

stacking a fourth integrated circuit package having a fourth peripheral contact on the third integrated circuit package to form a fourth package overhang along a package fourth edge;

electrically connecting the third peripheral contact and a package substrate contact along the package third edge; and electrically connecting the fourth peripheral contact and a package substrate contact along the package fourth edge.

6. A stacked integrated circuit package-in-package system comprising:

forming a first integrated circuit package having a first peripheral contact and a first encapsulation;

forming a second integrated circuit package having a second peripheral contact and a second encapsulation;

stacking the second integrated circuit package on the first integrated circuit package in a multidirectional offset stack configuration with the first peripheral contact and the second peripheral contact exposed, the multidirectional offset stack configuration provides a second package overhang with the second integrated circuit package above the first integrated circuit package;

electrically connecting the first peripheral contact and a package substrate contact along a package first edge; and electrically connecting the second peripheral contact and a package substrate contact along a package second edge.

7. The system as claimed in claim 6 further comprising forming an inner contact on a second package substrate of the second integrated circuit package.

8. The system as claimed in claim 6 further comprising:

forming an integrated circuit die having a peripheral bond pad;

stacking the first integrated circuit package on an active side of the integrated circuit die in the multidirectional offset stack configuration with the peripheral bond pad exposed and a first package overhang above the integrated circuit die; and electrically connecting the peripheral bond pad and the package substrate contact.

9. The system as claimed in claim 6 further comprising:

stacking the first integrated circuit package on a non-active side of an integrated circuit die;

stacking a third integrated circuit package having a third peripheral contact on the second integrated circuit package to form a third package overhang along a package third edge;

electrically connecting the integrated circuit die and the package substrate contact; and electrically connecting the third peripheral contact and the package substrate contact along the package third edge.

10. The system as claimed in claim 6 further comprising:

forming a third integrated circuit package having a third package substrate, the third package substrate has a third peripheral contact and an inner contact;

stacking the first integrated circuit package on a non-active side of an integrated circuit die;

stacking the third integrated circuit package on the second integrated circuit package to form a third package overhang along a package third edge;

forming an encapsulation having a recess to cover a portion of the third integrated circuit package, the recess exposes with the inner contact;

electrically connecting the integrated circuit die and the package substrate contact;

electrically connecting the third peripheral contact and the package substrate contact along the package third edge; and connecting a device on the inner contact in the recess.

11. A stacked integrated circuit package-in-package system comprising:

a first integrated circuit package having a first peripheral contact;

a second integrated circuit package having a second peripheral contact;

the second integrated circuit package on the first integrated circuit package in a multidirectional offset stack configuration with the first peripheral contact exposed, the multidirectional offset stack configuration provides a second package overhang with the second integrated circuit package above the first integrated circuit package;

a first interconnect between the first peripheral contact and a package substrate contact along a package first edge; and a second interconnect between the second peripheral contact and a package substrate contact along a package second edge.

12. The system as claimed in claim 11 further comprising:

the first interconnect between the first peripheral contact and a package substrate contact along a package third edge opposite to the package first edge; and the second interconnect between the second peripheral contact and the package substrate contact along a package fourth edge opposite to the package second edge.

13. The system as claimed in claim 11 further comprising:
the second integrated circuit package having a second package substrate, the second package substrate has an inner contact and the second peripheral contact;
an encapsulation having a recess to cover a portion of the second integrated circuit package, the recess exposes with the inner contact; and
a device on the inner contact in the recess.

14. The system as claimed in claim 11 further comprising:
the first integrated circuit package on an integrated circuit die; and
a die interconnect between the integrated circuit die and the package substrate contact.

15. The system as claimed in claim 11 further comprising:
a third integrated circuit package having a third peripheral contact on the second integrated circuit package to form a third package overhang along a package third edge;
a fourth integrated circuit package having a fourth peripheral contact on the third integrated circuit package to form a fourth package overhang along a package fourth edge;
a third interconnect between the third peripheral contact and a package substrate contact along the package third edge; and
a fourth interconnect between the fourth peripheral contact and a package substrate contact along the package fourth edge.

16. The system as claimed in claim 11 wherein:
the first integrated circuit package has the first peripheral contact and a first encapsulation;
the second integrated circuit package has the second peripheral contact and a second encapsulation;
the second integrated circuit package is on the first integrated circuit package in the multidirectional offset stack configuration with the first peripheral contact and the second peripheral contact exposed, the multidirectional offset stack configuration provides the second package overhang with the second integrated circuit package above the first integrated circuit package;
the first interconnect between the first peripheral contact and the package substrate contact along the package first edge is a first bond wire; and
the second interconnect between the second peripheral contact and the package substrate contact along a package second edge is a second bond wire.

17. The system as claimed in claim 16 further comprising an inner contact on a second package substrate of the second integrated circuit package.

18. The system as claimed in claim 16 further comprising:
an integrated circuit die having a peripheral bond pad;
the first integrated circuit package on an active side of the integrated circuit die in the multidirectional offset stack configuration with the peripheral bond pad exposed and a first package overhang above the integrated circuit die; and
a third interconnect between the peripheral bond pad and the package substrate contact.

19. The system as claimed in claim 16 further comprising:
the first integrated circuit package on a non-active side of an integrated circuit die;
a third integrated circuit package having a third peripheral contact on the second integrated circuit package to form a third package overhang along a package third edge;
a die interconnect between the integrated circuit die and the package substrate contact; and
a third interconnect between the third peripheral contact and the package substrate contact along the package third edge.

20. The system as claimed in claim 16 further comprising:
a third integrated circuit package having a third package substrate, the third package substrate has a third peripheral contact and an inner contact;
the first integrated circuit package on a non-active side of an integrated circuit die;
the third integrated circuit package on the second integrated circuit package to form a third package overhang along a package third edge;
an encapsulation having a recess to cover a portion of the third integrated circuit package, the recess exposes with the inner contact;
a die interconnect between the integrated circuit die and the package substrate contact;
a third interconnect between the third peripheral contact and the package substrate contact along the package third edge; and
a device on the inner contact in the recess.

* * * * *